(12) United States Patent
Ikeda

(10) Patent No.: US 6,642,598 B2
(45) Date of Patent: Nov. 4, 2003

(54) SEMICONDUCTOR DEVICE

(75) Inventor: Masahiro Ikeda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/356,517

(22) Filed: Feb. 3, 2003

(65) Prior Publication Data
US 2003/0146486 A1 Aug. 7, 2003

(30) Foreign Application Priority Data

Feb. 4, 2002 (JP) ......................................... 2002-026927

(51) Int. Cl.⁷ .............................................. H01L 29/00
(52) U.S. Cl. ........................................ 257/499; 257/909
(58) Field of Search ................................. 257/499, 506, 257/510, 513, 202, 618, 773, 909

(56) References Cited

FOREIGN PATENT DOCUMENTS

| JP | 2000-114258 | 4/2000 |
|---|---|---|
| JP | 2001-176959 | 6/2001 |

*Primary Examiner*—Mark V. Prenty
(74) *Attorney, Agent, or Firm*—McGinn & Gibb, PLLC

(57) ABSTRACT

In the semiconductor device according to the present invention having a plurality of function macro formation regions on the principal face of a semiconductor substrate, the plurality of function macro formation regions include at least a first function macro formation region where a first function macro is formed and a second function macro formation region where a second function macro different from the first function macro is formed, each function macro formation region has an element formation region where an element is formed, a plurality of dummy semiconductor regions where no element is formed and isolation trenches filled with a predetermined insulating material mutually isolating between the plurality of dummy semiconductor regions, and the dummy semiconductor region in one function macro formation region has mutually identical plane shape and identical area and the area of the first dummy semiconductor region included in the first function macro formation region and the area of the second dummy semiconductor region included in the second function macro formation region are different.

24 Claims, 11 Drawing Sheets

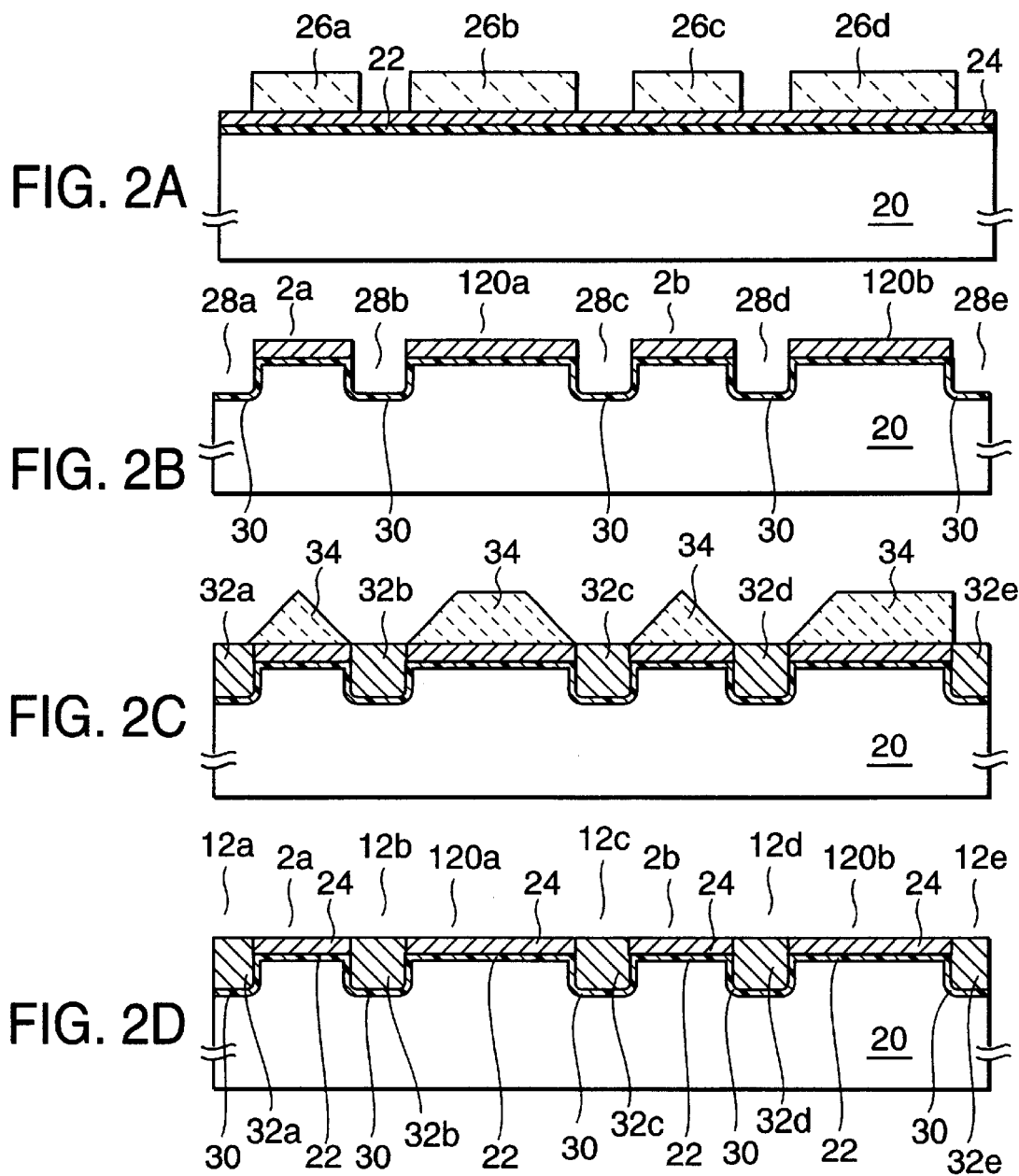

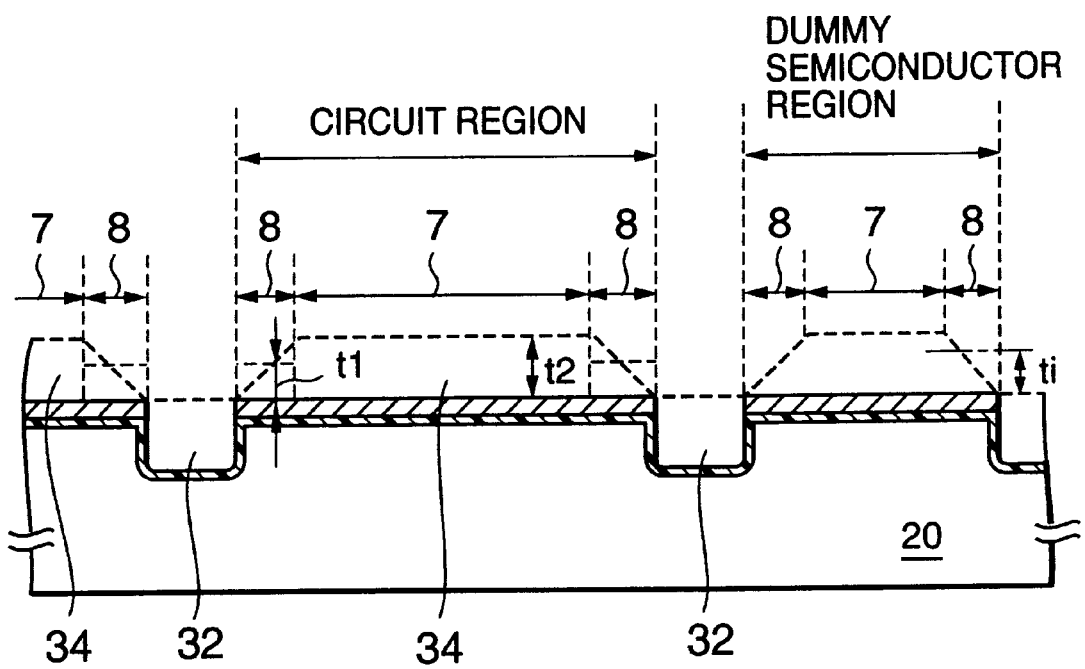

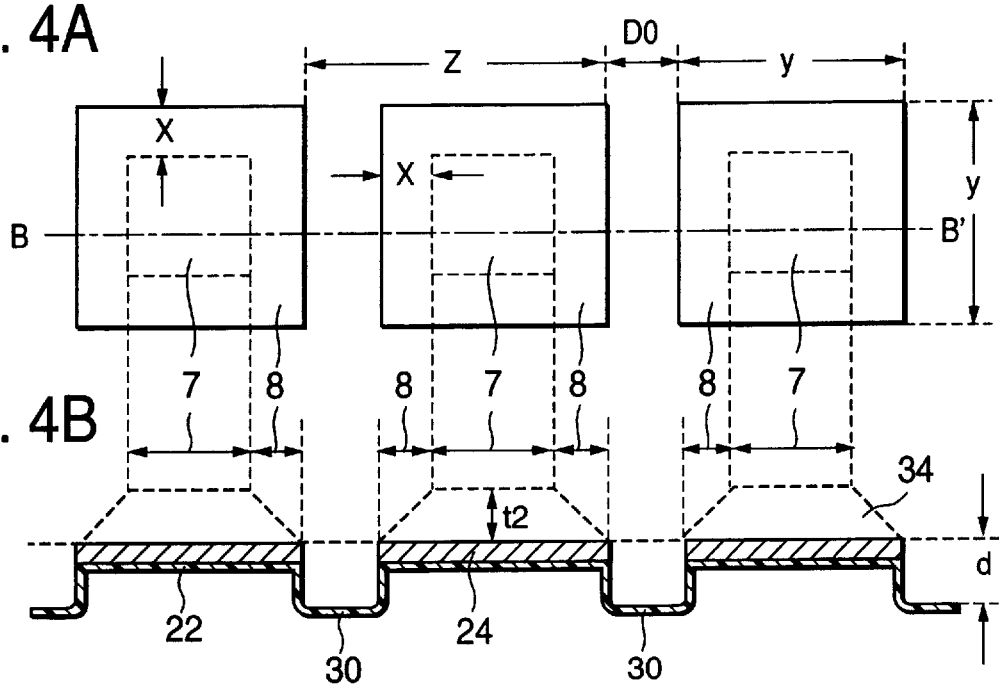
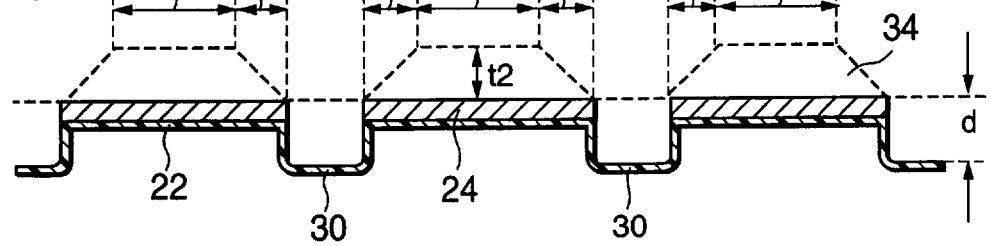
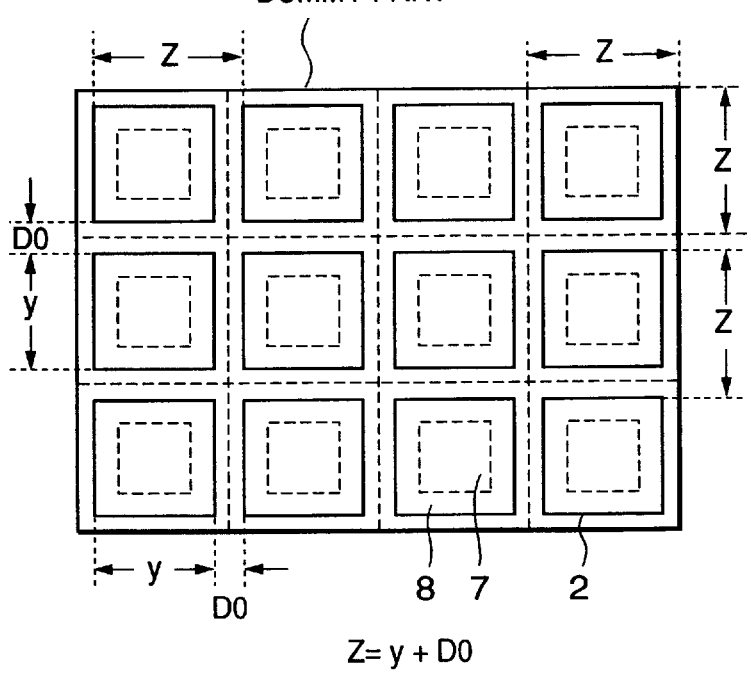
FIG. 4A
FIG. 4B
FIG. 4C
DUMMY PART
$Z = y + D0$

FIG. 11
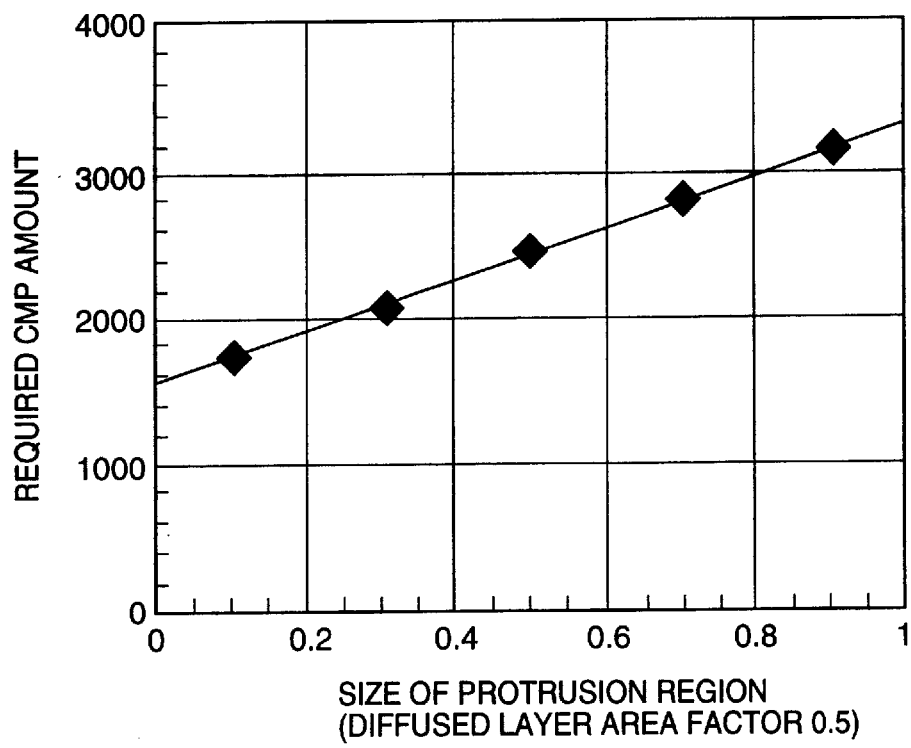
SIZE OF PROTRUSION REGION
(DIFFUSED LAYER AREA FACTOR 0.5)
FIG.12A
FIG.12B
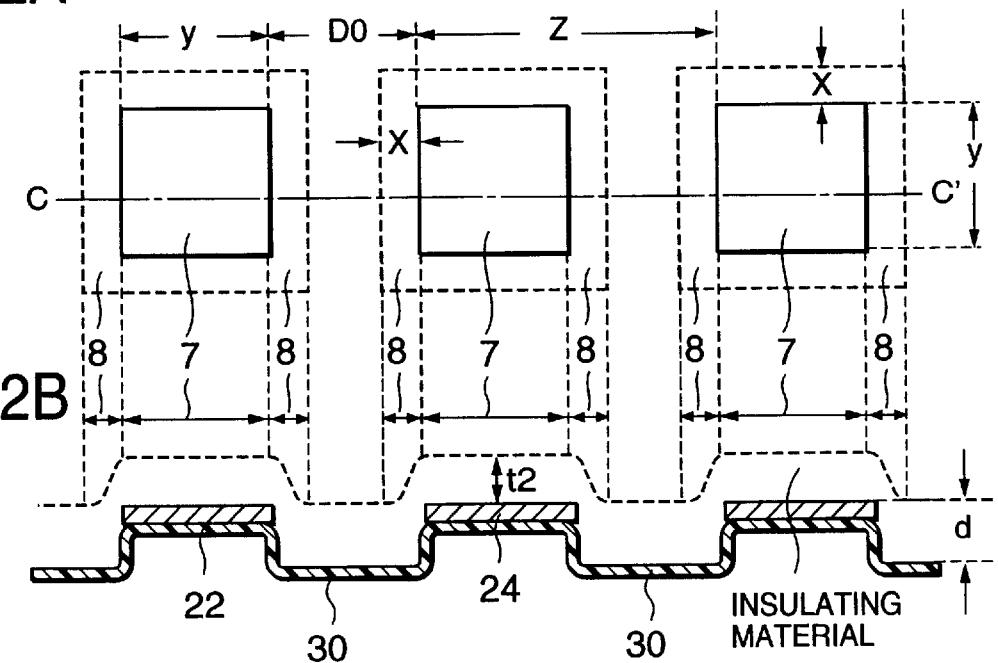

SEMICONDUCTOR DEVICE

BACKGROUND OF THE INVENTION

1. Field of the Invention

The present invention relates to a semiconductor device, and more particularly to a semiconductor device having shallow trench element isolation (referred to as STI hereinafter) regions, obtained by forming shallow trenches in a semiconductor substrate and filling them in with an insulating material, or a multilayer wiring structure.

2. Description of the Prior Art

Accompanying the progress in refinement and high integration of semiconductor devices, refinement of the area of the element isolation region for electrically isolating each circuit element has also been advanced along with a refinement of each circuit element itself mounted on the semiconductor device. In particular, as an element isolation method replacing the LOCOS method that is embracing such a problem as the bird's beak, the STI technique which does not produce transition regions such as the bird's beak in the boundary of an active region and the element isolation region, and is also excellent in flattening the substrate surface, has been adopted widely in recent years. However, it has been revealed that even the STI technique is infested by such problems as will be described below.

Namely, in forming an STI region for isolating the active region it is necessary to flatten the substrate surface, and for that purpose, the chemical mechanical polishing (referred to as CMP hereinafter) technique that has a superior capability for flattening microscopic regions has mainly been employed. More specifically, the STI region is obtained, for example, by forming isolation trenches on the semiconductor substrate, filling in the isolation trenches with an insulating material by depositing the insulating material on the entire surface of the semiconductor substrate, and then flattening the surface of the semiconductor substrate by polishing the insulating material deposited on the regions other than the isolation trenches, that is, the protrusion regions of the semiconductor substrate.

However, it has been known that the STI technique possesses also an essential problem of the dependence of the etching rate of the insulating material being the object of polishing on the density of the underlying pattern. That is, it has a polishing characteristic that the etching rate is low when the protrusion region has a high density, and the etching rate is high when it has a low density. Accordingly, when regions with different pattern densities exist mingled together, the flatness of the surface after CMP exhibits dispersion due to the difference in the etching rate caused by the variation in the density of the pattern.

In order to resolve the dispersion problem in the flatness of the surface after CMP due to the difference in the etching rate caused by the variation in the density of the pattern, various kinds of proposals have been presented in the past.

For example, in Japanese Patent Applications Laid Open, No. 2000-114258 (referred to as disclosed example 1 hereinafter), there is proposed a semiconductor device in which when there exists a variation in the distribution of the protrusion regions necessary for the circuit operation arranged in the semiconductor device, first dummy protrusions with a fixed shape useless for the circuit operation are arranged periodically in regions with sparse distribution of the protrusions, and second dummy protrusions with arbitrary shapes useless for the circuit operation are arranged in regions where the disposition of the first dummy protrusions does not suffice to compensate for the variation in the density. FIG. 7 illustrates layout of the semiconductor device disclosed in the disclosed example 1. On a silicon substrate 611, a plurality of protrusions 612, identified by hatching, necessary for the circuit operation are arranged as a circuit pattern. The manner in which the protrusions 612 appear indicates a distribution that has a variation in the density. In this example, for the region where the arrangement density of the protrusions 612 is sparse, first dummy protrusions 613 useless for the circuit operation are arranged together with the protrusions 612. The first dummy protrusions 613 of a rectangular pattern (in FIG. 7, it is a square pattern) are arranged periodically. Specifically, as the first dummy protrusions, square patterns with side length of 5 μm are arranged with an interval of 3 μm. Moreover, sparse regions that still remain unfilled even by the regular arrangement of the first dummy protrusions 613, are further supplemented by the arrangement of arbitrarily shaped second dummy protrusions 614. The second dummy protrusions 614 which are useless for the circuit operation are formed at the same time with the formation of the protrusions 612 and the first dummy protrusions 613.

Furthermore, Japanese Patent Applications Laid Open No. 2001-176959 (referred to as disclosed example 2 hereinafter) proposes to provide two kinds of large and small dummy patterns in the isolation region in order to obtain a semiconductor device of satisfactory surface flatness by enhancing uniformity of polishing rate when an isolation oxide film is polished by a CMP method. FIGS. 8A to 8C are plan views for illustrating the semiconductor device described in the disclosed example 2. Referring to FIG. 8, in the semiconductor device, two kinds of large and small dummy patterns 711 that will serve as dummy active regions are provided in an isolation region 710 of a semiconductor substrate 712, and large dummy patterns 711b are arranged regularly arrayed at positions far from principal patterns 709, while small dummy patterns 711a are arranged in the gaps formed in the periphery of the principal patterns 709.

In the prior art including the disclosed examples 1 and 2, even after isolation trenches formed in the semiconductor substrate are filled with an insulating material such as an oxide film and then subjected to CMP, suppression of variation in the flatness within the wafer plane or within the chip has still been insufficient.

Moreover, even if the deposition thickness of the insulating material that fills in the isolation trenches is devised so as to have a constant value, there is a problem that the variation in the flatness is increased On the contrary when the circuit patterns on the wafer are different.

In spite of these circumstances, effective measures against problems in the above have not been found so far. Because of this, it has been necessary in the CMP process to adjust complicated polishing conditions for each product, which led also to the problem of obstructing the enhancement of the efficiency of manufacturing and stabilization of processes.

BRIEF SUMMARY OF THE INVENTION

Summary of the Invention

In the semiconductor device according to the present invention having a plurality of function macro formation regions on the principal face of a semiconductor substrate, the plurality of function macro formation regions include at least a first function macro formation region in which a first function macro is formed, and a second function macro formation region in which a second function macro different from the first function macro is formed, each function macro formation region has an element formation region in which and element is formed, a plurality of dummy semiconductor regions in which elements are not formed, and isolation trenches, filled with a predetermined insulating material, which mutually isolate the element formation region and the plurality of dummy semiconductor regions, and the dummy semiconductor region in a function macro formation region has mutually identical plane shape and identical area, and the area of a first dummy semiconductor region included in the first function macro formation region and the area of a second dummy semiconductor region included in the second function macro formation region are different.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 1 is a drawing for describing an embodiment of the semiconductor device of this invention, where

FIGS. 2A to 2D are process sectional views showing schematically the cross-section along line A–A' in FIG. 1C for each principal process;

FIG. 3 is a schematic sectional view showing the definition of each size for calculating the length of the side when the dummy semiconductor region is assumed to be a square;

FIG. 4 is a drawing showing the definition of various sizes when assuming that the dummy semiconductor region is a square, where FIG. 4A is a schematic plan view, FIG. 4B is a schematic sectional view along line B–B' in FIG. 4A, and FIG. 4C is a schematic plan view of the dummy part when it is filled up with the dummy semiconductor regions at a predetermined pitch;

FIG. 8 is a drawing for describing the semiconductor device disclosed in Japanese. Patent Applications Laid Open, No. 2001-176959, where

FIG. 11 is a graph showing the change in the required CMP amount as a function of the size of the protrusion region;

FIG. 12 is a drawing showing the definition of each size for the case where the offset parts are formed on the outside of the protrusion regions when the dummy semiconductor region is assumed to be a square, where FIG. 12A is a schematic plan view and FIG. 12B is a schematic sectional view along line C–C' in FIG. 12A.

DETAILED DESCRIPTION OF THE INVENTION

It has been recognized that when a predetermined insulating material or the like is deposited so as to surely fill in at least recessed parts following a process of formation of pattern of protrusions and recesses, such as in the formation of the STI regions for element isolation and in the formation of a lower wiring pattern, and then the chip surface having the deposited material is flattened by means of the CMP technique, it is not possible to sufficiently suppress the dispersion of flatness within the chip, or even if the deposition thickness of the insulating material that fills the isolation trenches is regulated to be constant, the dispersion of flatness is increased on the contrary when the circuit patterns on the wafer are different. After a considerable effort in clarifying the cause of the above-mentioned phenomenon, the present inventor obtained a finding as will be described in the following.

Figure 9:
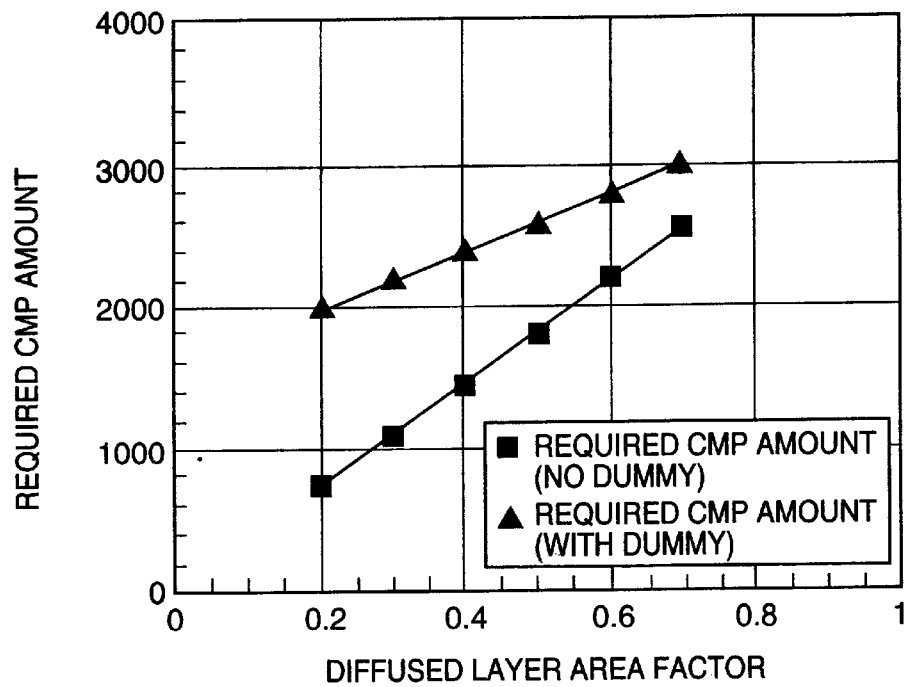
FIG. 9 is the graph of an example showing the dependence of the required CMP amount on the diffused layer area factor.

Namely, in the STI technique, in order to flatten the chip surface after filling a predetermined insulating material in the isolation trenches, unwanted amount of the insulating material is removed by CMP. In this process it was found by this inventor that the total amount (volume) of the insulating material that has to be removed by polishing for the purpose of flattening, normalized to an amount per unit area, (the normalized amount will be referred to as required CMP amount hereinafter) varies as a function of the ratio of the area of the protrusion regions occupying in the total area of the chip (referred to simply as protrusion part area factor hereinafter). FIG. 9 shows an example of the dependence of the required CMP amount on the ratio of the area of the protrusion regions with formed circuit elements occupying in the area of the chip when the thickness of the deposited film is constant (the ration being referred to as diffused layer area factor hereinafter), and an example of the dependence of the required CMP amount when dummy patterns with a certain size are added to the chip with each diffused layer area factor, by taking the diffused layer area factor and the required CMP amount on the abscissa and the ordinate, respectively. As can be seen from FIG. 9, since the eventual difference in the protrusion part area factor can be decreased by the addition of the dummy patterns, the extent of the variation in the required CMP amount corresponding to the diffused layer area factor can be relaxed appreciably but not eliminated completely.

The above finding means that when a large number of function macros are mounted on one chip as occurs in system LSIs which are developed vigorously in recent years, if the function macros differ, for example, like in a memory macro and a logic processing macro, it is normal that the densities of the transistors included in the function macros are also different, so hat there arises a difference in the required CMP amount between different function macros. In addition, since the density of the element, such as the MOS transistor, on the chip varies largely for each product such as a system LSI, memory LSI, or a microcomputer, it means also that the required CMP amount differs for each product.

Figure 10A:
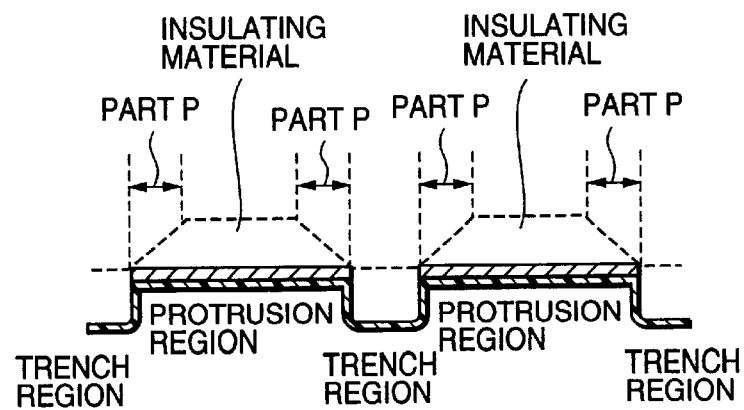
FIGS. 10A and 10B are sectional views schematically showing examples of deposition profile of the insulating material in the boundary part of the protrusion region and the isolation trench part.

Moreover, when the insulating material is deposited following opening of the isolation trenches, it is known that in the boundaries of the protrusion regions and the isolation trench parts, portions with different thickness are generated, as shown, for example, in parts P and parts Q in FIG. 10, depending on the distance from the boundary. This effect is larger for the smaller size of the protrusion region or for the larger peripheral length of the protrusion region. FIG. 11 is a graph showing the effect, and shows the change in the required CMP amount as the size of individual protrusion region is changed while keeping the ratio of the area of the protrusion regions occupying in the chip (protrusion area factor) at a constant value (0.5), taking the size (relative value) of the individual protrusion region and the required CMP amount on the abscissa and the ordinate, respectively. As can be seen from FIG. 11, even if the protrusion area factor is kept constant, the required CMP amount is changed when the size of individual protrusion changes. Accordingly, it became clear that a mere arrangement of nearly uniform dummy patterns, although the size of the sparse region in the distribution is taken into consideration in response to the density of the distribution of the protrusion regions as is done in the conventional method, is bound to have a limit in suppressing the dispersion of flatness within the chip even if it can bring the protrusion area factor to a constant level.

As a result of further concentrated effort based on the above findings, the present inventor discovered that the problem in the above can be solved by managing the total volume of the insulating material removed by the CMP process. The present invention which is an outcome based on this finding, has a feature in that by arranging dummy patterns appropriate to each function macro formation region with an appropriate arrangement space, the required CMP amount in each function macro formation region at the time when the insulating material is deposited to a thickness has just filled in the recesses, becomes equal to the optimum average film thickness of the insulating material determined by the manufacturing processes and design criteria applicable to the manufacture of the chip including the function macro formation regions. In this case, the dummy pattern size, the plane shape and the arrangement space are made constant within one function macro formation region. Referring to the drawings, this invention will be described in the following.

Figure 1A:
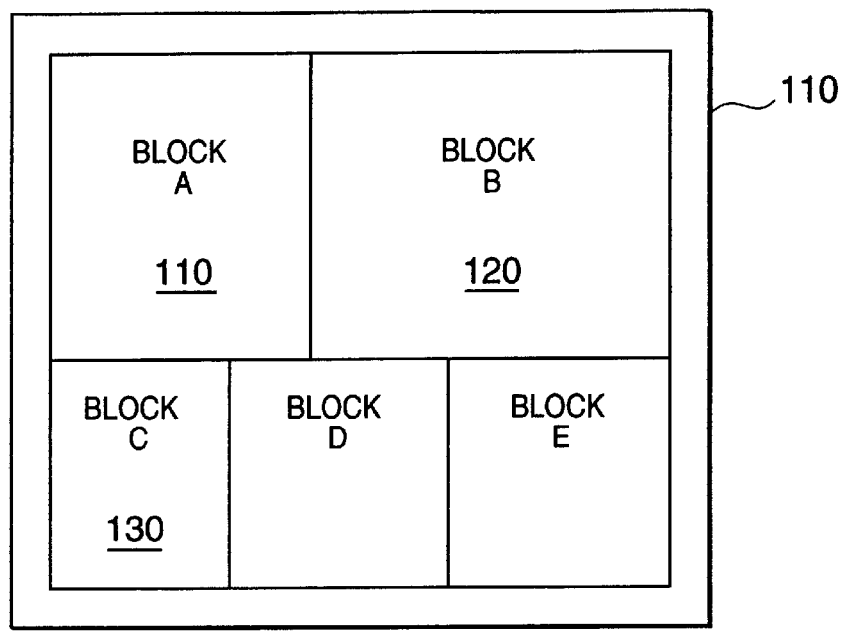
FIG. 1A is a schematic plan view of a chip belonging top the semiconductor device.
Figure 1B:
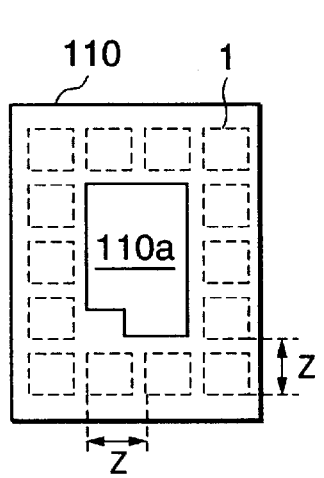
FIGS. 1B to 1D are schematic plan views showing the element isolation region formation patterns for block A, block B and block C, respectively, that are mounted on the chip.
Figure 1C:
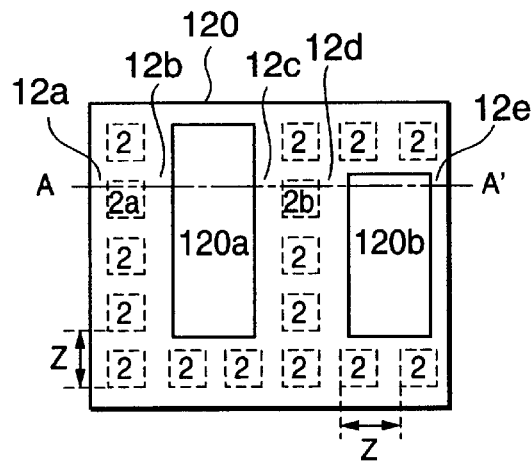
Figure 1D:
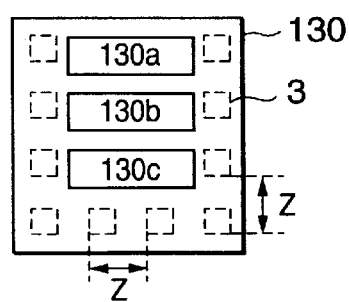

FIG. 1 is a drawing for describing an embodiment of the semiconductor device according to the invention in which FIG. 1A is a schematic plan view of a chip 100 belonging to the semiconductor device, FIGS. 1B to 1D are respectively schematic plan views showing the STI region formation patterns for a block A110, a block B120 and a block C130. Referring to FIG. 1, the chip 100 is mounted with, for example, the block A110, the block B120, the block C130, a block D and a block E being first to fifth function macros, and further is equipped with an input/output buffer circuit and connection electrodes for supply of power for driving each element mounted on the chip 100 and is connected to the outside and for input/output of predetermined signals, neither of them being shown explicitly.

Moreover, the block A110, for example, is constituted by including a circuit region 110a being an element formation region where a circuit element constituting a first function macro is to be formed, and a plurality of dummy semiconductor regions 1 where actually no circuit element is formed, and similarly, the block B120 is constituted by including circuit regions 120a and 120a where circuit elements are formed and a plurality of dummy semiconductor regions 2, 2a and 2b, and the block C130 is constituted by including circuit regions 130a, 130b and 130c where the circuit elements are formed and a plurality of dummy semiconductor region 3. In addition, although description and illustration are omitted, each of the block D and block E is constituted by including circuit regions for forming circuit elements corresponding to respective functions and dummy semiconductor regions corresponding to respective block area and diffused region areas.

Furthermore, the dummy semiconductor regions included in each block have mutually identical plane shape, for example, square shape, and identical size within the block. Moreover, the size (length of the side in the case of a square) is calculated based on the area of the block, the area of the circuit regions included in the block, processes applied, design criteria, and the like as will be described later, However, when the sum of the space D0 between adjacent regions of the dummy semiconductor regions when mutual dummy semiconductor regions are adjacent via exclusively an STI region, and the size of the dummy semiconductor region is called adjacent dummy arrangement pitch Z, the value of Z is normally set to be a common value for every block. Namely, for example, the adjacent dummy arrangement pitches for dummy semiconductor regions 1, 2 and 3 in the blocks 110, 120 and 130 are all set to the same value Z.

Next, the formation method of the isolation structure by the STI technique will be described briefly. FIG. 2 shows schematic sectional views a long line A–A' in FIG. 1C drawn for each principal process. Referring to FIG. 2, first, a silicon oxide film 22 is formed on the surface of a silicon substrate 20 in the form of a wafer to a thickness of, for example, about 10 nm, then a silicon nitride film (referred to as SiN film hereinafter) 24 is deposited for about 150 nm. Next, a photoresist (referred to as PR hereinafter) is applied and an isolation trench formation pattern is exposed, and isolation trench formation parts are opened, leaving PRs 26b and 26d on the circuit regions 120a and 120a, and PRs 26a and 26c on the dummy semiconductor regions 2a and 2b (FIG. 2A).

Next, the silicon oxide film 22 and the SiN film 24 in the isolation trench formation part are removed by dry etching, and further the silicon substrate 20 is etched by a prescribed depth, for example, about 300 nm, forming an isolation trench which includes openings 28a to 28e. As a result, circuit regions including the circuit regions 120a and 120b, and the dummy semiconductor regions including the dummy semiconductor regions 2a and 2b form protrusion regions. Next, after all PRs on the silicon substrate including PRs 26a to 26d are removed, the surface of the openings 28a to 28e is oxidized to form a silicon oxide film 30 with a predetermined thickness (FIG. 2B).

Next, a high density plasma chemical vapor deposition silicon oxide film (referred to as HDP oxide film hereinafter), for example, as a predetermined insulating material, is deposited on the entire surface to a predetermined thickness to fill in the openings 28a to 28e with HDP oxide films 32a to 32e. In this case, an HDP oxide film 34 is deposited naturally also on the protrusion regions including the circuit regions 120a and 120b and the dummy semiconductor regions 2a and 2b (FIG. 2C). Here, the thickness of the HDP oxide film is such that the total depth to the surface of the SiN film 24 on the protrusion regions including the circuit regions 120a and 120b and the dummy semiconductor regions 2a and 2b, is about 460 nm which is the sum of the depth of the isolation trench and each thickness of the silicon oxide film 22 and the SiN film, if the depth of the isolation trench is about 300 nm as shown above. If the thickness of deposition is about 460 nm in the flat part of the HDP oxide film 34 on the circuit region 120a, it is possible to fill in up to the height of the SiN oxide film 24 on the protrusion regions including the circuit regions 120a and 120b and the dummy semiconductor regions 2a and 2b.

Next, the HDP oxide film 34 on the protrusion regions including the circuit regions 120A and 120a and the dummy semiconductor regions 2a and 2b is removed by CMP. As a result, respective STI regions including STI regions 12a to 12e filled respectively with the HDP oxide films 32a to 32e in the openings 28a to 28e are formed. At the same time, the surface of each STI region and the surface of the protrusion regions including the circuit regions 120a and 120b and the dummy semiconductor regions 2a and 2b are flattened (FIG. 2D).

Next, among design methods where the plane shape of each dummy semiconductor region of each function macro included in the chip 100 of this embodiment, a case of element isolation process in which offset parts 8, where the thickness of the insulating material 34 varies depending upon the position in the direction perpendicular to the boundary in the vicinity of the boundary between the circuit region and the dummy semiconductor region, occur in the circuit region and the dummy semiconductor region will be described as an example. The dummy semiconductor region in the chip according to the present embodiment is characterized in that it is designed for each function macro. FIG. 3 is a schematic sectional view showing the definition of each size and region needed for description in what follows, and FIG. 4 is a drawing showing the definition of each size when the dummy semiconductor region is assumed to be a square, where FIG. 4A is a schematic plan view, FIG. 4B is a schematic sectional view along line B–B' in FIG. 4A, and FIG. 4C is a schematic plan view of the dummy part filled with the arrangement of the dummy semiconductor regions with an adjacent dummy arrangement pitch Z. Referring to FIGS. 1, 3 and 4, a method of calculating the length of the side of the dummy semiconductor region 2 will be described specifically with the block B120 being the second function macro, for example, as an example of the function macro which becomes the design object of the dummy semiconductor region.

First, the pattern of the circuit regions 120a and 120b that are element formation regions included in the block 120 will be designed. As a result, the total area of the circuit regions 120a and 120b will be calculated. Here, the area of the block 120 is called S $\mu m^2$, and the total area of the circuit regions 120a and 120b is called Sd0 $\mu m^2$, and the diffused layer area factor $\alpha$ is defined by $\alpha$=Sd0/S. In addition, when the insulating material 34 is deposited, and the total area of the flat parts 7 of the circuit regions 120a and 120b is called Sd1, the flat part area factor $\beta$ is defined by $\beta$=Sd1/S.

Moreover, the optimum average film thickness and the offset value of the insulating material determined by the manufacturing processes and the design criteria applicable to the manufacture of the chip 100 are set ti $\mu m$ and X $\mu m$, respectively, the length of the side of the dummy semiconductor region is set yam, the adjacent dummy space of the dummy semiconductor regions via the STI region is set D0 $\mu m$, the adjacent dummy arrangement pitch is set Z (=y+D0) $\mu m$, the thickness of the flat parts 7 when the insulating material 34 is deposited just to fill in the isolation trenches, and the average film thickness of the insulating material 34 in the offset part 8 where the film thickness of the insulating material 34 varies depending upon the position in the direction perpendicular to the boundary in the vicinity of the boundary between the isolation trenches and the circuit regions 120a and 120b are set t1 $\mu m$ and t2 $\mu m$, respectively, and the average film thickness of the insulating material 34 in the dummy parts other than the circuit regions 120a and 120b of the block 120 is set tx $\mu m$. Then, since the contributions to the required CMP amount in the block B120 of the portions to become the flat parts 7 in the circuit regions 120a and 120b, the offset parts 8 of the circuit regions 120a and 120b, and the dummy parts are $\beta$ t1, ($\alpha-\beta$) t2, and $(1-\alpha)$ tx, in order to make the required CMP amount in the block B120 equal to the optimum average film thickness ti $\mu m$, tx needs be determined so as to satisfy the following expression:

$$t1+(\alpha-\beta)t2+(1-\alpha)tx=ti.$$

Moreover, if it is assumed that the dummy part is completely filled by arranging dummy semiconductor regions 2 with the length of side y with the adjacent dummy arrangement pitch Z (=y+D0), as in FIG. 4C, the area factor ad of the dummy semiconductor region 2 in the dummy part and the dummy flat part area factor $\beta$ are given by $\alpha d=y^2/Z^2$ and $\beta d=(y-2X)^2/Z^2$, respectively.

Furthermore, the average thickness tx of the insulating material 34 in the dummy part is given, with the film thickness of the flat part 7 in the dummy semiconductor region, the offset value and the average film thickness of the insulating material 34 in the offset part 8 are called t1, X and t2, respectively, as in the case of the circuit regions 120a and 120b, is given by the following expression:

$$tx=\beta dt_1+(\alpha_d-\beta_d)t_2=[(y-2X)^2/Z^2]t_1+[(4yX-4X^2)/Z^2]t_2.$$

Accordingly, in order to make the required CMP amount in the block B120 to be equal to t1 $\mu m$ there is needed to determine the length of the side y of the dummy semiconductor region by the following formula.

$$y=[-C+(C^2+2t_1XC+t_1t_xZ^2)^{1/2}]/t_1, \quad (1)$$

where $$t_x=[t_i-(\alpha-\beta)t_2-\beta t_1]/(1-\alpha),$$

$$C=2X(t_2-t_1).$$

If one takes $\alpha$=0.5, $\beta$=0.3, t1=0.5 $\mu m$, t2=0.15 $\mu m$, ti=0.25 $\mu m$, X=0.5 $\mu m$ and Z=4 $\mu m$, for example, one obtains tx=0.14 $\mu m$ and y=2.77 $\mu m$.

Figure 5A:
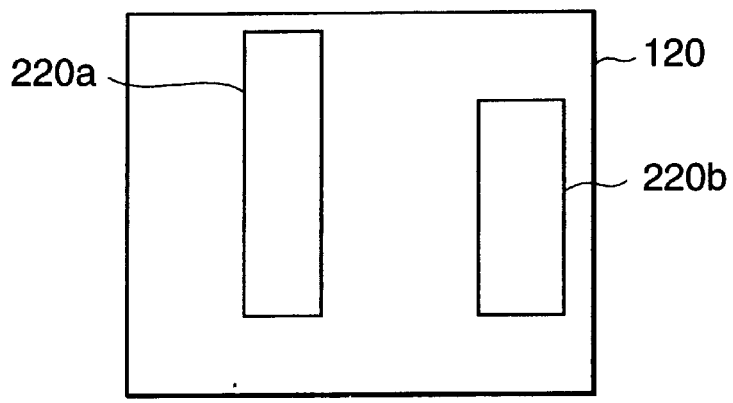
FIGS. 5A to 5D are plan views of schematic pattern for describing arrangement method of the dummy semiconductor regions.
Figure 5B:
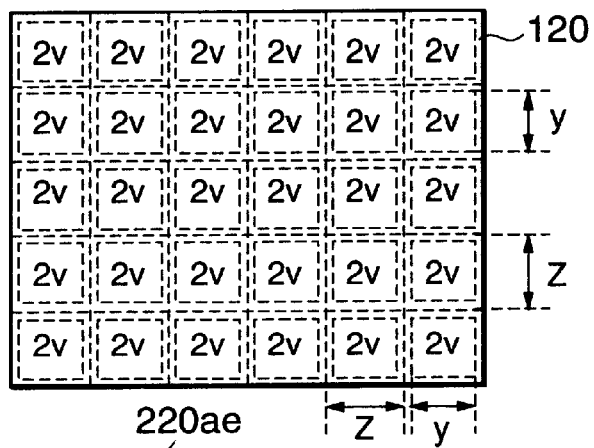

Next, by taking the block B120 as an example of the function macro of design object, the arrangement method of the dummy semiconductor region 2 of a square with the length of the side 2.77 $\mu m$ will be described. FIG. 5 is a schematic plan view of the pattern for describing the arrangement method. In the block B120, patterns 220a and 220b of the circuit regions 120a and 120a are designed in advance (FIG. 5A). First, a tentative diffused layer formation region pattern of the block B120 is generated by arranging a first square pattern 2v with a side of 2.77 $\mu m$ which is the pattern of the dummy semiconductor region 2 over the entire region of the block B120 with the pitch of Z (=4 $\mu m$) in a matrix form (FIG. 5B) More specifically, after densely covering first the entire region of the block B120 with, for example, a tentative virtual square pattern of a side Z, the first square patterns 2v need be arranged at the centers of the virtual squares. Then, the patterns 220a and 220b designed in advance are enlarged by a predetermined size to generate tentative circuit region patterns 220ae and 220be that are enlarged element formation region patterns. Normally, the predetermined size suffices to be the minimum width Wm $\mu m$ needed for the isolation trench formation.

Figure 5C:
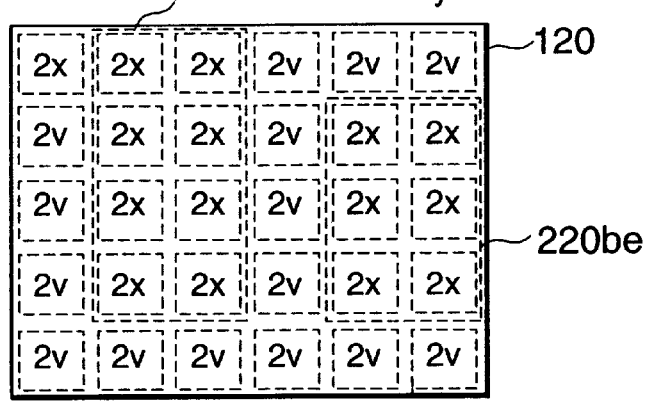

Next, the tentative circuit region patterns 220*ae* and 220*be* are overlapped on the tentative diffused layer region formation patterns so as to have the patterns 220*a* and 220*b* of the circuit regions 120*a* and 120*b* are located at the design positions ('FIG. 5C).

Figure 5D:
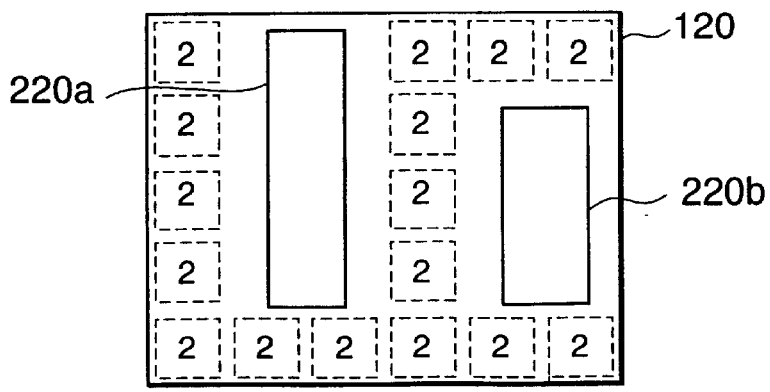

Next, all of the first square patterns 2*x* which overlap even with a part (however, excluding the cases of contact with a side or a point) of the tentative circuit region patterns 220*ae* and 220*be* are removed. Next, by replacing the tentative circuit region patterns 220*ae* and 220*be* with the patterns 220*a* and 220*b* of the circuit regions 120*a* and 120*b* there can be generated isolation trench formation patterns which serve for element isolation of the block B120 in which the remaining first square patterns 2*v* act as the patterns for the dummy semiconductor regions 2 (FIG. 5D).

It is to be noted that in this arrangement method, there is a possibility that blank spaces are generated in spite of the fact that there exist rooms for arranging the dummy semiconductor regions 2, depending upon the arrangement or size of the circuit regions.

Figure 13A:
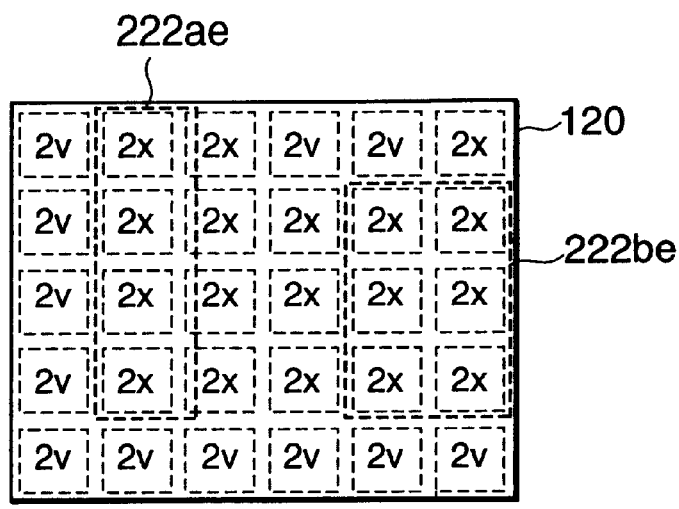
FIGS. 13A to 13C are schematic plan views for describing blank regions that may be generated in arranging the dummy semiconductor region patterns.
Figure 13B:
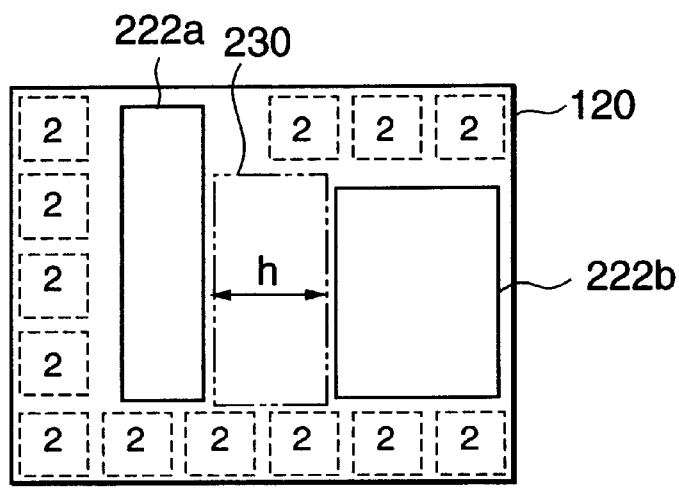
Figure 13C:
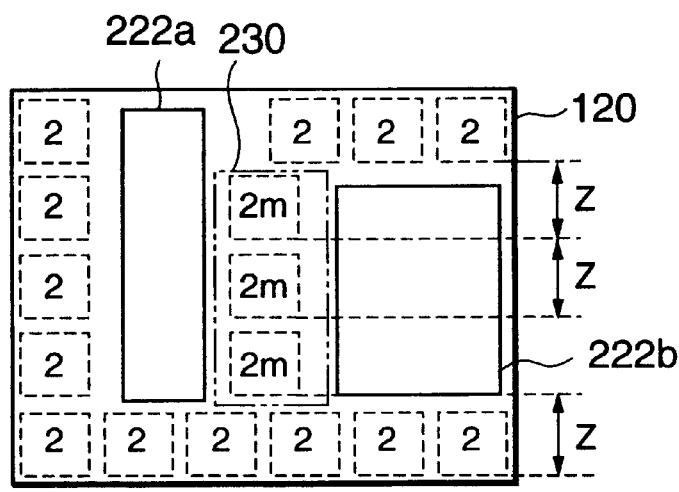

FIG. 13 is a schematic plan view for describing such a specific example. Referring to FIG. 13, if one generates an isolation trench formation patterns following the procedure in the above by assuming, for example, that the design result for the circuit regions included in the block B120 are patterns 222*a* and 222*b* and tentative circuit region patterns 222*ae* and 222*be*, a blank region 230 which is a wide rectangular isolation trench formation region, as it is, will be generated as shown in FIG. 13B. However, there may occur a case in which the blank region 230 is separated into two parts by a plurality of dummy semiconductor regions.

In such a case, when mutually perpendicular arrangement directions in a matrix-like arrangement of a first square pattern 2*m* in the block 120 are called first and second directions, and the length in the first direction of the blank region 230 is called h μm (space between the pattern 222*a* and pattern 222*b* in the present example), if there exists a number k (0 or appositive integer) that satisfies the conditions $$y+Z>h-kZ \geq y+2Wm, \quad (a)$$

it is possible to arrange first square patterns 2*m* which become (k+1) dummy semiconductor region patterns in the first direction by translating the positions of the first square patterns in the first direction. More specifically, if k is 0 or an integer, by placing the center of one of the first square patterns 2*m* to overlap with the straight line in the second direction passing the center in the first direction of the blank region 230, and positioning the first square pattern 2*m* while keeping the adjacent dummy space D0 on both sides of the first direction, it is possible to arrange a total of (k+1) first square patterns in the first direction of the blank region, thus eliminating the blank region. FIG. 13 illustrates an example where k=0. When k is an odd integer, by setting the straight line in the second direction, passing the center in the first direction of the blank region 230, to be at the center between the two first square patterns 2*m* to be adjacent in the first direction and arranging the two first square patterns while keeping the adjacent dummy space D0 on both sides of these two adjacent first square patterns 2*m* in the first direction, it is possible to arrange a total of (k+1) first square patterns 2*m* in the first direction of the blank region, thus eliminating the blank region. When there is a blank region in the second direction, the blank region can be eliminated in exactly the same manner as in the first direction, so that its description will be omitted. The presence of such a blank region 230 can readily be detected by performing predetermined design rule check (DRC) by using, for example, Eq. (a) in the above following the formation of the isolation trench patterns, and it is just needed to add appropriate number of the first square pattern 2*m* in response to the detection result.

In the CMP process, the optimum film thickness of the insulating material 34 for achieving desired flattening is normally determined in response to the value of the required CMP amount ti in the above, When the film thickness of deposition is set constant, the value of ti is determined by the ratio of the area of the protrusion regions including the circuit regions and the dummy semiconductor regions to the area of each block, and the ratio of the area of the offset parts to the area of the protrusion regions. Specifically, the value of ti increases together with the increase in the ratio of the area of the protrusion regions to the area of the block. Moreover, even when the ratio of the area of the protrusion regions to the area of the block remains constant, the value of ti decreases with the increase in the ratio of the area of the offset parts to the area of the block, in other words, with the decrease in the area of individual protrusion regions.

Figure 10B:
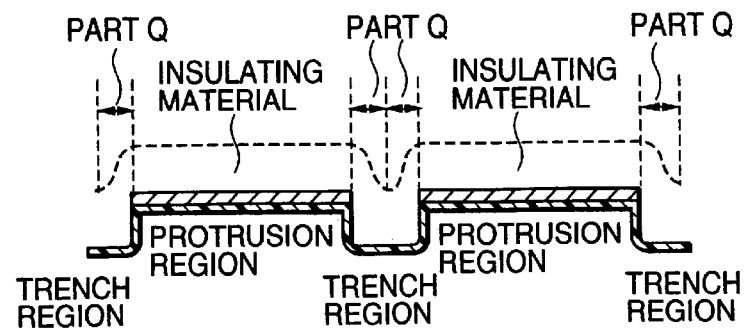

When the deposition form of the insulating material is as shown in FIG. 10B, which occurs as, for example, in the case of deposition of an oxide film as the insulating film by plasma chemical vapor deposition using tetraethylorthosilicate (TEOS) and oxygen as reaction gas, the offset parts are generated on the outside of the protrusion regions including the circuit regions 120*a* and 120*b* and the dummy semiconductor regions. FIGS. 12A and 12B illustrate the case where the offset parts 8 occur on the outside of the protrusion regions, and they are drawings showing the size definition which correspond to FIGS. 4A and 4B when the protrusion regions are approximated almost by the flat parts 7 in the examples of FIGS. 3 and 4. In this case, when the total area calculated from the design patterns of the circuit regions 120*a* and 120*b* is called Sd0 μm², and the area of the offset parts in the periphery of the circuit regions 120*a* and 120*b* is called Sfs μm², the diffused layer area factor α' and the flat part area factor β' are defined by α'=(Sd0+Sfs)/S and β'=Sd0/S, respectively. If it is assumed that the dummy part is filled up by arranging the dummy semiconductor regions 2 with the side length y μm with the adjacent dummy arrangement pitch Z μm as in FIG. 4C, the area factor αd' of the dummy semiconductor region 2 in the dummy part and the dummy flat part area factor βd' are defined by αd'=(y+ 2X)²/Z² and βd'=Sd0/S, respectively. In this case, since the insulating material of the offset parts in the periphery of the circuit regions 120*a* and 120*b* contribute to the average film thickness tx of the dummy parts, the value of tx needs be determined so as to make the following expression valid, on the assumption that the definitions of t1, t2 and ti are the same as in the above: β't1+(1−β) tx=ti. Moreover, tx in this case can be represented by the following expression:

$$t_x = \beta_d' \cdot t_1 + [(\alpha_d' - \beta_d') + M] t_2,$$

where $$M = (\alpha' - \beta')/(1 - \beta').$$

Accordingly, in order to have the required CMP amount in the block B120 to be equal to ti μm, the length y of the side of the dummy semiconductor region needs be determined by the following expression:

$$y = \{D + [D^2 - 2t_x XD + (t_1 t_x - M t_1 t_2) Z^2]^{1/2}\}/t_1, \quad (2)$$

Where $$t_x=(t_i-\beta' t_1)/(1-\beta').$$

$$D=2Xt_2.$$

In case the difference between y and Z determined by the above method is decreased and becomes less than the minimum size value for forming the isolation trenches, it needs only to increase Z and recalculate y based on Eq. (1) or (2).

Each function macro to be mounted on the chip 100 belonging to the semiconductor device of this embodiment, it is possible to unite the optimum required CMP amount for each macro to the same value by adding dummy semiconductor regions of the size and shape determined by the above method, at preparation of isolation trench formation pattern for element isolation. Accordingly, considering the entirety of the chip 100 in FIG. 1, for example, by calling the portions other than blocks A to E, namely, all the regions including the input/output circuit parts, connection electrode parts, and the like, as block P temporarily, and by providing dummy semiconductor regions by the same method as in the above for the block P, it is possible to make the optimum required CMP amount for the chip as a whole to the same value, and make the surface of the chip 100 after the element isolation process to be the more flat.

Moreover, since the value of ti can be kept at the same value even for other products with different combinations of function macros to be mounted on the chip by designing each function macro by the above method, it is possible to keep the process conditions for the deposition of the insulating material and the subsequent CMP process, and enhance the production efficiency of the semiconductor devices to a large extent.

Figure 6:
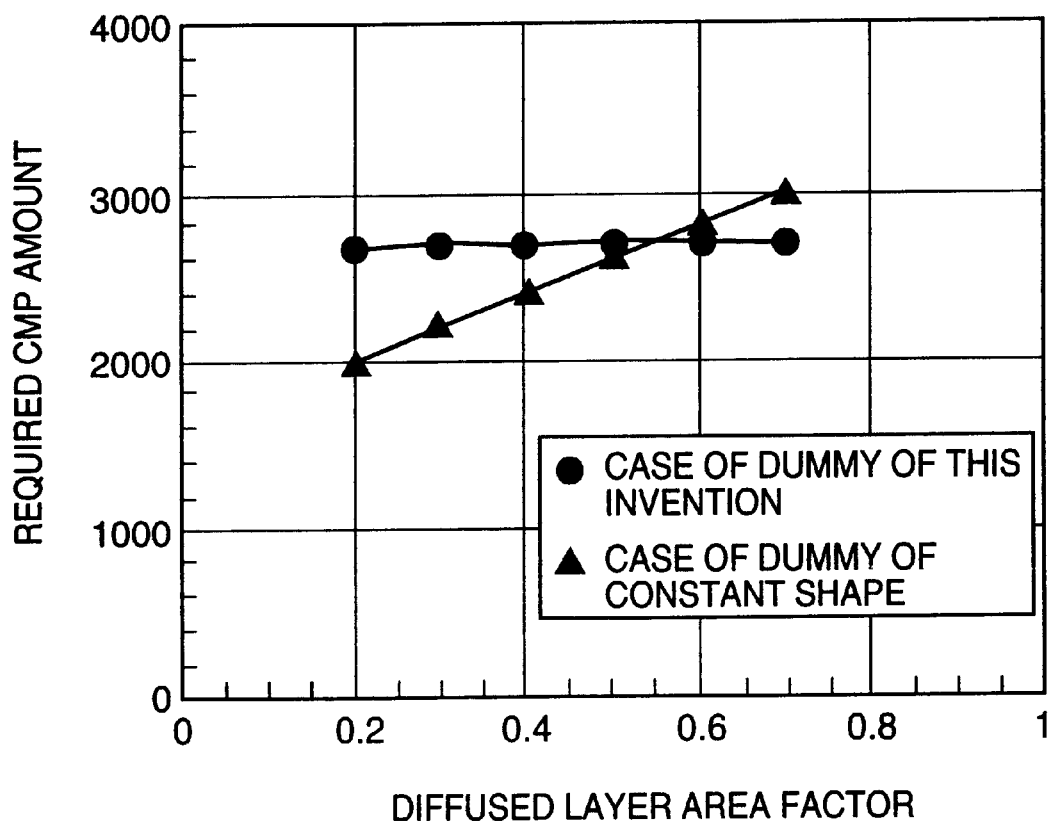
FIG. 6 is a graph showing the dependence of required CMP amount in the CMP process to the area factor of the circuit region.
Figure 7:
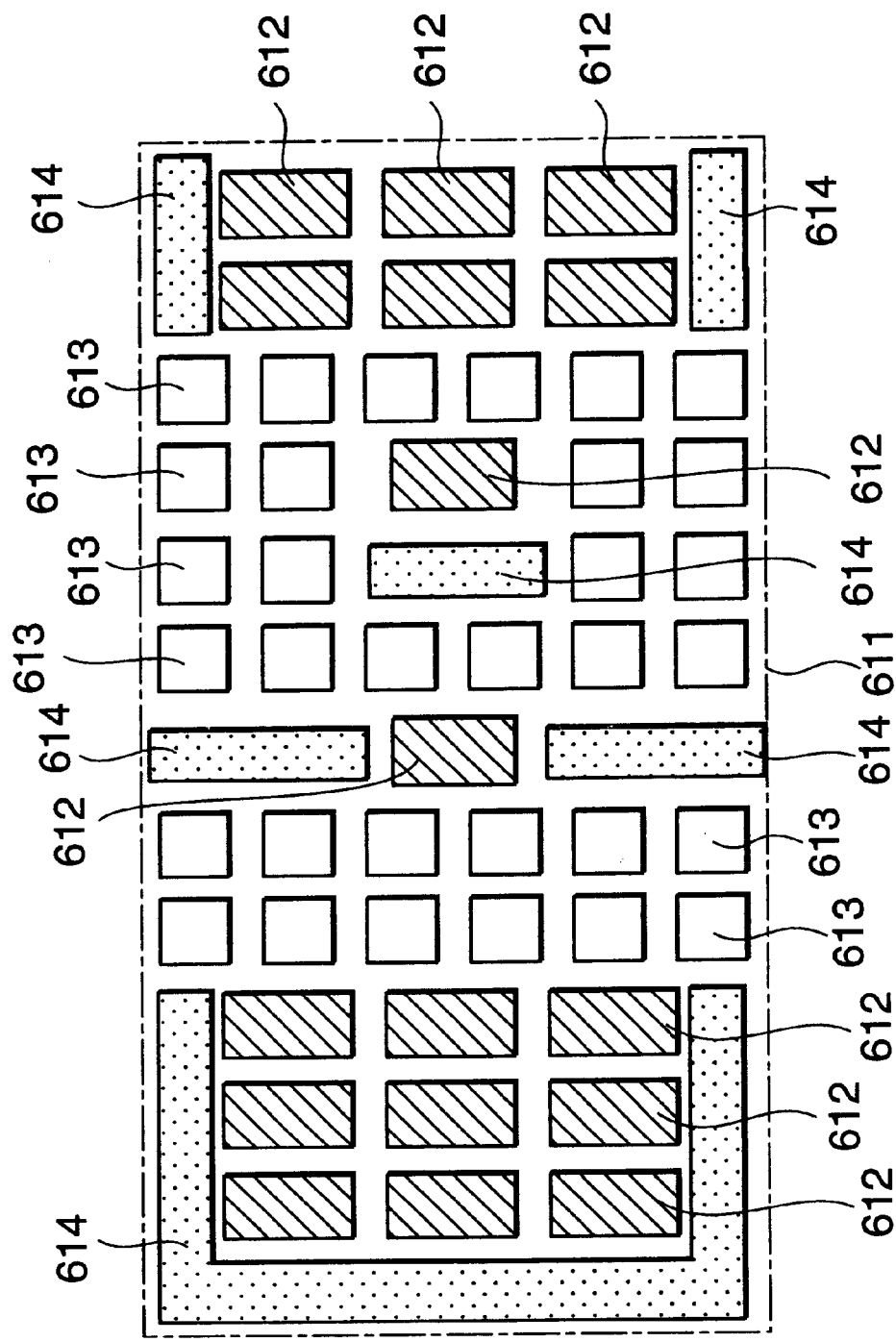
FIG. 7 is the layout of the semiconductor device disclosed in Japanese Patent Applications Laid Open, No. 2000-114258.
Figure 8A:
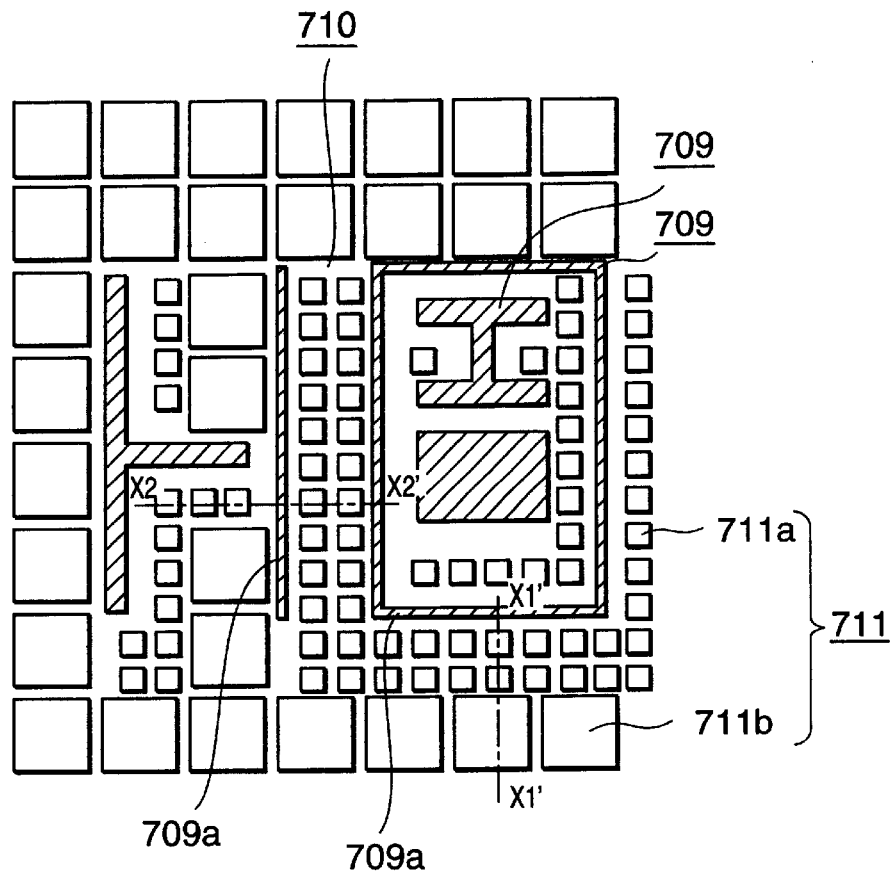
FIG. 8A is a plan view and FIGS. 8B and 8C are sectional views of X1–X1' part and X2–X2' part, respectively, in FIG. 8A.
Figure 8B:
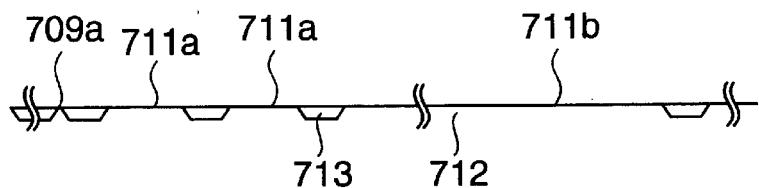
Figure 8C:
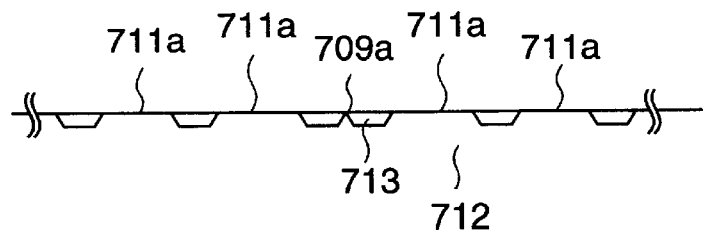

FIG. 6 is a graph showing for an arbitrary function macro, the dependence of the optimum required CMP amount in the CMP process on the area factor (ratio of the circuit region area to the function macro area), for the case of arranging dummy semiconductor regions of fixed shape and size and the case of calculating the size of the dummy semiconductor regions according to the method of this invention, by taking the area factor and the required CMP amount (arbitrary scales) on the abscissa and ordinate, respectively. As can be seen from the graph, by calculating the size of the dummy semiconductor region by the method of this invention to obtain the dummy semiconductor region for the function macro, it is possible to maintain the optimum required CMP amount for the CMP process at a constant value even if the area factor of the circuit region varies, so that the dispersion of flatness within the chip can be further reduced and maintain the conditions for the CMP process constant, and can enhance the production efficiency to a large extent.

Moreover, if the design method of this invention has been applied by uniting the value of the required CMP amount ti in designing the layout pattern of each function macro, even for the case in which, for example, function macros designed by a different designer or a designer group are to be used for system development by combining them within one chip, there is no need at least for the function macro regions to newly design the dummy semiconductor region for flattening, and an efficient design can be attained.

Moreover, in the above embodiment, the present invention has been described with the case of applying the CMP process in the formation of the STI regions for isolating the elements, the invention can also be applied to a case in which a layer insulating film is deposited on an upper layer after formation of wirings in a chip having a multilayer wiring structure, and has a need for flattening the surface of a first wiring layer of the lower layers. More specifically, in the first wiring layer of the object function macro, by handling the area of the normal wiring patterns which perform transmission of signals or supply of power for realizing the desired function of the function macro corresponds to the area of the circuit region in the description of the embodiment, and a first layer insulating film deposited on the first wiring layer corresponds to the insulating material filling the isolation trenches in the above embodiment, exactly similar parameters as in the above embodiment can be defined, though their concrete values may be different depending upon the applicable manufacturing processes and the, design criteria, so that the size determination of the dummy wiring patterns of the first wiring layer and their arrangement within the function macro regions can be done precisely similar to the above embodiment, and therefore their detailed description will be omitted.

Furthermore, an entirely similar idea to the embodiment can be applied, although the specific computational expressions for determining the size of the dummy wiring pattern are different, to semiconductor devices which employ the damascene method which forms desired wirings as the formation method of the wirings, in which an insulating material is deposited on a flattened substrate to a predetermined thickness, trenches are formed at places of formation of wirings, a metal being the wiring material is filled in the trenches, to form desired wirings by removing the metal outside the trenches by CMP.

That the present invention is not limited to what has been described in the above , and can be modified in various ways within the scope of the idea is obvious. For example, the shape of the dummy pattern may be a circle, a rectangle or a regular polygon. Moreover, the above embodiment describes an example in which the distance Z between adjacent dummy centers is set in advance and then y is determined. However, it may be arranged such that y is set in advance and the distance Z between the adjacent dummy centers is determined based on Eq. (1) or (2).

As described in the above, according to the semiconductor device of this invention, by depositing a predetermined insulating material or the like so as to surely fill in at least recesses, after a process of forming an irregular pattern, as, for example, in the formation of STI regions for element isolation or the formation of a lower layer wiring pattern of multilayer wirings, and flatten the chip surface consisting of the deposited material by means of CMP technique, an effect which further suppresses the dispersion of flatness within the chip.

Although the invention has been described with reference to a specific embodiment, this invention is not meant to be construed in a limiting sense. Various modifications of the disclosed embodiment will become apparent to persons skilled in the art upon reference to the description of the invention. It is therefore contemplated that the appended claims will cover any modifications or embodiments as fall within the true scope of the invention.

What is claimed is:

1. A semiconductor device having a plurality of function macro formation regions on the principal face of a semiconductor substrate, the plurality of said function macro formation regions include at least a first function macro formation region where a first function macro is formed and a second function macro formation region where a second function macro different from said first function macro is formed, each of said function macro formation regions has an element formation region where an element is formed, a plurality of dummy semiconductor regions where no element is formed and isolation trenches which isolate mutually between said element formation region and the plurality of dummy semiconductor regions, said dummy semiconductor regions in said function macro formation region have mutually identical plane shape and identical area, and the area of the first dummy semiconductor region included in said first function macro formation region and the area of the second dummy semiconductor region included in said second function macro formation region are different.

2. A semiconductor device having a plurality of function macro formation regions on the principal face of a semiconductor substrate, the plurality of said function macro formation regions include at least a first function macro formation region where a first function macro is formed and a second function macro formation region where a second function macro different from said first function macro is formed, each of said function macro formation regions has an element formation region, where an element is formed, a plurality of dummy semiconductor regions where no element is formed and isolation trenches filled with a predetermined insulating material which mutually isolate between said element formation region and the plurality of said dummy semiconductor regions, and in the plurality of said function macro formation regions, the plane shape and area of said dummy semiconductor regions are constant, and the adjacent dummy space of said dummy semiconductor regions mutually adjacent via said isolation trenches is different in said first function macro formation region and in said second function macro formation region.

3. The semiconductor device as claimed in claim 1, where in each of said function macro formation regions mounted on said semiconductor device, the center distance between adjacent dummies of said dummy semiconductor regions adjacent via said isolation trenches is constant.

4. The semiconductor device as claimed in claim 1, where in one of said function macro formation regions mounted on said semiconductor device, the adjacent dummy space of said dummy semiconductor regions mutually adjacent via said isolation trenches is constant.

5. A semiconductor device having a plurality of function macro formation regions on the principal face of a semiconductor substrate, the plurality of said function macro formation regions include at least a first function macro formation region where a first function macro is formed, and a second function macro formation region where a second function macro different from said first function macro is formed, each of said function macro formation region has an element formation region where an element is formed, a plurality of dummy semiconductor regions where no element is formed and isolation trenches filled with a predetermined isolating material mutually isolating between said element formation region and the plurality of said dummy semiconductor regions, said dummy semiconductor regions in one of said function macro formation regions have mutually identical plane shape and identical area and the adjacent dummy space of said dummy semiconductor regions mutually adjacent via said isolation trenches is constant within the function macro formation region, and when the area of the first dummy semiconductor region and said adjacent dummy space included in said first function macro formation region are called S1 $\mu m^2$ and D1 $\mu m$, respectively, and the area of the second dummy semiconductor region and said adjacent dummy space included in said second function macro formation region are called S2 $\mu m^2$ and D2 $\mu m$, respectively, these quantities satisfy the relation $$(S1-S2)^2+(D1-D2)^2 \neq 0.$$

6. A semiconductor device having a plurality of function macro formation regions on the principal face of a semiconductor substrate, the plurality of said function macro formation regions include at least a first function macro formation region where a first function macro is formed and a second function macro formation region where a second function macro different from said first function macro is formed, each of said function macro formation region has an element formation region where an element is formed, a plurality of dummy semiconductor regions where no element is formed and isolation trenches filled with a predetermined insulating material for mutually isolating between said element formation region and the plurality of dummy semiconductor regions, said dummy semiconductor region in one of said function macro formation regions has mutually identical plane shape and identical area and the adjacent dummy space of said dummy semiconductor regions mutually adjacent via said isolation trenches is constant within the function macro formation region, and when the area of the first dummy semiconductor region and the distance between said adjacent dummy centers included in said first function macro formation region are called S1 $\mu m^2$ and Z1 $\mu m$, respectively, and when the area of the second dummy semiconductor region and the distance between said adjacent dummy centers included in said second function macro formation region are called S2 $\mu m^2$ and Z2 $\mu m$, respectively, these quantities satisfy the following relation $$(S1-S2)^2+(Z1-Z2)^2 \neq 0.$$

7. The semiconductor device as claimed in claim 1, wherein either one of the area of said dummy semiconductor region or said adjacent dummy space is determined based at least on the area of said function macro formation region including the dummy semiconductor region, the total area of said element formation regions included in the function macro formation region, and the offset value determined by the method of filling up said isolation trenches with said insulating material.

8. The semiconductor device as claimed in claim 1, wherein the plane shape of said dummy semiconductor region is a square.

9. The semiconductor device as claimed in claim 8, wherein, when adjacent dummy arrangement pitch is defined by Z=y+D0, with the length of the side of said semiconductor dummy region with a plane square shape is y $\mu m$ and the adjacent dummy space of the dummy semiconductor regions adjacent via said isolation trenches is D0 $\mu m$, and when diffused layer area factor which is the ratio of the total area of said element formation regions included in the function macro formation region to the area of said function macro formation region including the dummy semiconductor regions and flat part area factor which is the ratio of the flat surface area of said insulating material to the area of said element formation region when said insulating material is deposited, are called α and β, respectively, when optimum average film thickness and offset value of said insulating material determined by the applicable manufacturing method and design criteria are called ti $\mu m$ and X $\mu m$, respectively, and further when the film thickness of said flat part at deposition of said insulating material and the average film thickness of said insulating material in the offset part in which the film thickness of said insulating material varies at the position in the direction perpendicular to the boundary in the vicinity of the boundary between said element formation region and said isolation trench are called t1 μm and t2 μm, respectively, then these quantities satisfy the relation $$y=[-C+(C^2+2t_1XC+t_1t_xZ^2)^{1/2}]/t_1,$$

where $$t_x=[t_l-(\alpha-\beta)t_2-(\beta \cdot t_{1y}(1-\alpha) \text{ and } C=2X(t_2-t_1).$$

10. A semiconductor device having a plurality of function macro formation regions on the principal face of a semiconductor substrate, the plurality of said function macro formation regions include at least a first function macro formation region where a first function macro is formed, and a second function macro formation region where a second function macro different from said first function macro is formed, each of said function macro formation regions has a normal wiring connected to an element formed on said semiconductor substrate and a plurality of dummy wirings which are not connected to said element and a predetermined insulating film deposited on said normal wiring and said dummy wirings, the plurality of said dummy wirings included in one of said function macro formation regions have mutually identical plane shape and identical area, and the area of a first dummy wiring included in said first function macro formation region and the area of a second dummy wiring included in said second function macro formation region are different.

11. A semiconductor device having a plurality of function macro formation regions on the principal face of a semiconductor substrate, the plurality of said function macro formation regions include at least a first function macro formation region where a first function macro is formed and a second function macro formation region where a second function macro which is different from said first function macro is formed, each of said function macro formation region has a normal wiring connected to an element formed on said semiconductor substrate and a plurality of dummy wirings which are not connected to said element and a predetermined insulating film deposited on said normal wiring and said dummy wirings, the plurality of said dummy wirings included in the plurality of said function macro formation regions have mutually identical plane shape and identical area and the adjacent dummy space of said dummy wirings mutually adjacent via said isolation trenches is different in said first function macro formation region and in said second function macro formation region.

12. The semiconductor device as claimed in claim 10, wherein the distance between adjacent dummy centers of said dummy wirings mutually adjacent via said insulating film is constant in each of said function macro formation regions.

13. The semiconductor device as claimed in claim 10, wherein the adjacent dummy space of said dummy wirings mutually adjacent via said insulating film is constant in each one of said function macro formation regions.

14. A semiconductor device having a plurality of function macro formation regions on the principal face of a semiconductor substrate, the plurality of said function macro formation regions include at least a first function macro formation region where a first function macro is formed and a second function macro formation region where a second function macro different from said first function macro is formed, each of said function macro formation regions has a normal wiring connected to an element formed on said semiconductor substrate, a plurality of dummy wirings not connected to said element and a predetermined insulating film deposited on said dummy wirings, the plurality of said dummy wirings included in each one of said function macro formation region have mutually identical plane shape and identical area and the adjacent dummy space of said dummy wirings mutually adjacent via said insulating film is constant within the function macro formation region, and when the area of the first dummy wiring and said adjacent dummy space included in said first function macro formation region are called S1 μm² and D1 μm, respectively, and when the area of the second dummy wiring and said adjacent dummy space included in said second function macro formation region are called S2 μm² and D2 μm, respectively, these quantities satisfy the relation $$(S1-S2)^2+(D1-D2)^2 \neq 0.$$

15. A semiconductor device having a plurality of function macro formation regions on the principal face of a semiconductor substrate, the plurality of said function macro formation regions include at least a first function macro formation region where a first function macro is formed and a second function macro formation region where a second function macro different from sad first function macro is formed, each of said function macro formation region has a normal wiring connected to an element formed on said semiconductor substrate, a plurality of dummy wirings not connected to said element and a predetermined insulating film deposited on said dummy wirings, the plurality of said dummy wirings included in one of said function macro formation regions have mutually identical plane shape and identical area and the distance between adjacent dummy centers of said dummy wirings mutually adjacent via said insulating film is constant within the function macro formation region, and when the area of the first dummy wiring and the distance between said adjacent dummy centers included in said first function macro formation region are called S1 μm² and Z1 μm, respectively, and when the area of the second dummy wiring and the distance between said adjacent dummy centers included in said second function macro formation region are called S2 μm and Z2 μm, respectively, these quantities satisfy the relation $$(S1-S2)^2+(Z1-Z2)^2 \neq 0.$$

16. The semiconductor device as claimed in claim 14, wherein either one of the area of said dummy wiring or said adjacent dummy space is determined based on at least the area of said function macro formation region including the dummy wirings, the total area of said normal wirings included in the function macro formation region and the offset value determined by the deposition method of said insulating material deposited on the dummy wirings.

17. The semiconductor device as claimed in claim 14, wherein the plane shape of said dummy wiring is a square.

18. The semiconductor device as claimed in claim 17, wherein when adjacent dummy arrangement pitch Z is defined by Z=y+D0, using the length of the side of said dummy wiring called y and the adjacent dummy space of the dummy wirings adjacent via said insulating film called D0, and when wiring area factor which is the ratio of the total area of the normal wirings formed on the same wiring layer as the dummy wirings among said normal wirings included in said function macro formation region including the dummy wirings to the area of the function macro formation region, and flat part area factor which is the ratio of the area of the flat parts of the surface of said insulating film to the area of said same layer normal wirings when said insulating film is deposited, are called α and β, respectively, and when the optimum average film thickness and the offset value of said insulating film determined by applicable manufacturing processes and design criteria are called ti μm and X μm, respectively, and further the film thickness when said insulating film is deposited and the mean film thickness of said insulating film in the offset parts where the film thickness of said insulating film varies at the position in the direction perpendicular to the boundary in the vicinity of said normal wirings, are called t1 μm and t2 μm, respectively, these quantities satisfy the relation $$y=[-C+(C^2+2t_1XC+t_1t_xZ^2)^{1/2}]/t_1,$$

where $$t_x=[t_i-(\alpha-\beta)t_2-(\beta t_1)]/(1-\alpha), \text{ and } C=2X(t_2-t_1).$$

19. The semiconductor device as claimed in claim 2, where in one of said function macro formation regions mounted on said semiconductor device, the adjacent dummy space of said dummy semiconductor regions mutually adjacent via said isolation trenches is constant.

20. The semiconductor device as claimed in claim 2, wherein either one of the area of said dummy semiconductor region or said adjacent dummy space is determined based at least on the area of said function macro formation region including the dummy semiconductor region, the total area of said element formation regions included in the function macro formation region, and the offset value determined by the method of filling up said isolation trenches with said insulating material.

21. The semiconductor device as claimed in claim 2, wherein the plane shape of said dummy semiconductor region is a square.

22. The semiconductor device as claimed in claim 11, wherein the adjacent dummy space of said dummy wirings mutually adjacent via said insulating film is constant in each one of said function macro formation regions.

23. The semiconductor device as claimed in claim 15, wherein either one of the area of said dummy wiring or said adjacent dummy space is determined based on at least the area of said function macro formation region including the dummy wirings, the total area of said normal wirings included in the function macro formation region and the offset value determined by the deposition method of said insulating material deposited on the dummy wirings.

24. The semiconductor device as claimed in claim 15, wherein the plane shape of said dummy wiring is a square.

* * * * *